(12) United States Patent
Allen et al.

(10) Patent No.: US 8,900,802 B2
(45) Date of Patent: Dec. 2, 2014

(54) POSITIVE TONE ORGANIC SOLVENT DEVELOPED CHEMICALLY AMPLIFIED RESIST

(71) Applicants: International Business Machines Corporation, Armonk, NY (US); JSR Corporation, Tokyo (JP)

(72) Inventors: Robert D. Allen, San Jose, CA (US); Ramakrishnan Ayothi, San Jose, CA (US); Luisa D. Bozano, Los Gatos, CA (US); William D. Hinsberg, Fremont, CA (US); Linda K. Sundberg, Los Gatos, CA (US); Sally A. Swanson, San Jose, CA (US); Hoa D. Truong, San Jose, CA (US); Gregory M. Wallraff, San Jose, CA (US)

(73) Assignees: International Business Machines Corporation, Armonk, NY (US); JSR Corporation, Tokyo (JP)

( * ) Notice: Subject to any disclaimer, the term of this patent is extended or adjusted under 35 U.S.C. 154(b) by 99 days.

(21) Appl. No.: 13/775,122

(22) Filed: Feb. 23, 2013

(65) Prior Publication Data

US 2014/0242526 A1     Aug. 28, 2014

(51) Int. Cl.
*G03F 7/26* (2006.01)
*G03F 7/32* (2006.01)

(52) U.S. Cl.
CPC ..................................... *G03F 7/325* (2013.01)
USPC ......................................................... 430/326

(58) Field of Classification Search
CPC .......... G03F 7/0392; G03F 7/20; G03F 7/325
USPC ................................................. 430/322, 326
See application file for complete search history.

(56) References Cited

U.S. PATENT DOCUMENTS

| | | |
|---|---|---|
| 3,586,504 A | 6/1971 | Coates et al. |
| 4,833,067 A | 5/1989 | Tanaka et al. |
| 5,126,230 A | 6/1992 | Lazarus et al. |
| 5,185,235 A | 2/1993 | Sato et al. |
| 5,266,424 A | 11/1993 | Fujino et al. |
| 5,554,312 A | 9/1996 | Ward |
| 5,846,695 A | 12/1998 | Iwata et al. |
| 6,599,683 B1 | 7/2003 | Torek et al. |
| 7,585,609 B2 | 9/2009 | Larson et al. |

(Continued)

FOREIGN PATENT DOCUMENTS

| | | |
|---|---|---|
| JP | 54143232 | 8/1979 |
| JP | 58219549 | 12/1983 |
| JP | 63259560 | 10/1988 |

OTHER PUBLICATIONS

Ito et al., Positive/negative mid UV resists with high thermal stability, SPIE 0771:24-31 (1987).

(Continued)

*Primary Examiner* — Brittany Raymond
(74) *Attorney, Agent, or Firm* — Karen Canaan; CanaanLaw, P.C.

(57) ABSTRACT

Provided is a method for developing positive-tone chemically amplified resists with an organic developer solvent having at least one polyhydric alcohol, such as ethylene glycol and/or glycerol, alone or in combination with an additional organic solvent, such as isopropyl alcohol, and/or water. The organic solvent developed positive tone resists described herein are useful for lithography pattern forming processes; for producing semiconductor devices, such as integrated circuits (IC); and for applications where basic solvents are not suitable, such as the fabrication of chips patterned with arrays of biomolecules or deprotection applications that do not require the presence of acid moieties.

36 Claims, 14 Drawing Sheets

(56) References Cited

U.S. PATENT DOCUMENTS

| | | |
|---|---|---|
| 7,851,140 B2 | 12/2010 | Tsubaki |
| RE42,128 E | 2/2011 | Egbe |
| 2002/0106589 A1 | 8/2002 | Rodney et al. |
| 2007/0269749 A1 | 11/2007 | Schenker |

OTHER PUBLICATIONS

Maltabes et al., lx Deep UV Lithography With Chemical Amplification for 1-Microti DRAM Production, SPIE 1262:3-7 (1990).

IPA Developer (100); CD = 200 nm LS

EG (100) Developer; CD = 200 nm LS

KrF Imaging Results for NORIA-MAdMA Resists

EG/IPA Developer (70/30); CD ≈ 200 nm LS

KrF Imaging Results for NORIA-MAdMA Resists

EG/Water Developer (90/10); CD = 200 nm LS

TMAH Developer (0.26N); CD = 60 nm LS

TMAH Developer (0.26N); CD = 40 nm LS

EG Developer (100); CD = 60 nm LS

EG Developer (100); CD = 40 nm LS

EG Developer (100); CD = 32 nm LS

EG Developer (100); CD = 36 nm LS

POSITIVE TONE ORGANIC SOLVENT DEVELOPED CHEMICALLY AMPLIFIED RESIST

JOINT RESEARCH AGREEMENT

The invention described herein is subject to a joint research agreement between International Business Machines Corporation and JSR Corporation.

TECHNICAL FIELD

The present invention relates generally to photoresists. More specifically, the present invention relates to positive tone resists that are capable of being developed with polyhydric alcohol-based solvents for high resolution imaging.

BACKGROUND OF THE INVENTION

As semiconductor device features continue to shrink in size, the task of meeting photoresist performance requirements for high resolution, low line edge roughness (LER) and high photo speed grows increasingly difficult. The challenges in simultaneously meeting the requirements for resolution, LER, and sensitivity are known in the art as the "RLS Tradeoff." Current generation chemically amplified photoresists, designed to be developed in alkaline base, are capable of high photo speeds, but exhibit unsatisfactory resolution and LER as feature sizes approach 20 nm. In comparison, high-performance solvent-developed non-chemically amplified resists, such as PMMA (poly methyl methacrylate) resists, have excellent resolution and LER, but have unacceptably poor photospeed in optical imaging.

The use of solvent development in lithography is not a new idea. In the 1950s, the earliest photoresist systems used organic solvents for developing resist films. See, e.g., William S. DeForest, Photoresist: Materials and Processes, McGraw-Hill, New York, 1975. The first generation 248 nm chemically amplified resist, the TBOC (t-butyloxycarbonyloxy) styrene resist, was described 25 years ago for development in an organic solvent. See, e.g., Ito et al., SPIE 0771, 24 (1987); and Maltabes et al., SPIE 1262, 2 (1990). Since the development of the TBOC resist, virtually all chemically amplified resists have been designed to be developed in aqueous base solutions; consequently, development of solvent-based resists has been largely ignored as an option for modern high resolution chemically amplified resists. Today, there is an on-going interest in organic developers for negative tone chemically amplified resists (see, e.g., U.S. Pat. No. 7,851,140 B2 to Tsubaki); however, there are few examples of organic developers for positive tone chemically amplified resists. The present invention addresses this need in the art.

SUMMARY OF THE INVENTION

The present invention provides a method comprising developing a positive tone image in a chemically amplified resist with an organic developer solvent comprising a polyhydric alcohol, wherein the organic developer solvent has no more than $2.6 \times 10^{-4}$ M hydroxide ions. In one embodiment, the organic developer solvent has no more than $1.0 \times 10^{-4}$ M hydroxide ions and in another embodiment, the organic developer solvent is free of hydroxide ions.

In further embodiments of the invention, the polyhydric alcohol is selected from the group consisting of ethylene glycol and glycerol. The developer may comprise the polyhydric alcohol solvent alone (neat) or in combination with water or another organic solvent. In one embodiment, the developer comprises a mixture of ethylene glycol and isopropyl alcohol. In another embodiment, the developer comprises a mixture of ethylene glycol and water. In a further embodiment, the developer comprises a mixture of glycerol and isopropyl alcohol.

In another embodiment, the chemically amplified resist comprises a composition selected from the group consisting of molecular glasses, polyhydroxystyrenes, styrenes having one or more pendant hexafluoroalcohol groups, acrylates, methacrylates, and methacrylate fluoroalcohols.

In one embodiment, the chemically amplified resist comprises styrenic NORIA molecular glass protected with a 2-methyl-2-adamantyl group (NORIA-MAdMA).

In another embodiment, the chemically amplified resist comprises the polyhydroxystyrene polymer, poly(4-hydroxystyrene-co-2-methyl-2-adamantyl methacrylate) (PHS-MAdMA).

In a further embodiment, the chemically amplified resist comprises a methacrylate-fluoroalcohol polymer selected from the group consisting of poly(5-acryloyloxy-2,6-norbornanecarbolactone-co-2-methyl-2-adamantyl methacrylate-co-2-[1',1',1'-trifluoro-2'-(trifluoromethyl)-2'-hydroxy)propyl-3-norbornyl methacrylate) (NBHFA-MAdMA); poly(5-acryloyloxy-2,6-norbornanecarbolactone-co-2-methyl-2-cyclopentayl methacrylate-co-2-[1',1',1'-trifluoro-2'-(trifluoromethyl)-2'-hydroxy)propyl-3-norbornyl methacrylate) (NBHFA-McPMA); and poly(5-acryloyloxy-2,6-norbornanecarbolactone-co-2-ethyl-2-cyclopentayl methacrylate-co-2-ethyl-2-adamantyl methacrylate-co-2-[1',1',1'-trifluoro-2'-(trifluoromethyl)-2'-hydroxy)propyl-3-norbornyl methacrylate) (NBHFA-EcEdMA).

In another embodiment, the chemically amplified resist comprises the methacrylate polymer, poly((1-methylcyclopentyl methacrylate)-co-(2-methyltricyclo[3.3.1.13,7]decan-2-yl methacrylate)-co-(3-(2-hydroxyethoxy)tricyclo[3.3.1.13,7]decan-1-yl methacrylate)-co-(4-oxa-5-oxotricyclo[4.2.1.03,7]nonan-2-yl methacrylate)) (HdMCpMA).

In a further embodiment, there is provided a method comprising the steps of: (a) dissolving, in a casting solvent, a composition comprising a resist polymer; (b) coating a substrate with the dissolved composition of step (a) to produce a resist film; (c) optionally baking the resist film of step (b); (d) exposing the resist film to radiation; (e) optionally baking the resist film of step (d); (f) developing the resist film with the organic developer solvent described herein to dissolve exposed regions of the film and produce a positive-tone image on the substrate; and (g) optionally rinsing the film with water after development.

In one embodiment, the resist polymer composition of step (a) further includes a photoacid generator (PAG). In a preferred embodiment, the PAG is triphenylsulfonium perfluoro-1-butanesulfonate (TPS-N).

In another embodiment, the resist polymer composition of step (a) further includes a quencher, which may be selected from the group consisting of base quenchers and radiation sensitive quenchers. In a preferred embodiment, the radiation sensitive quencher is the photodecomposable base (PDB), triphenylsulfonium heptafluorobutyrate (TPS-HFB). In another embodiment, the radiation sensitive quencher is a PDB selected from the group consisting of Structures (1)-(10):

(1)

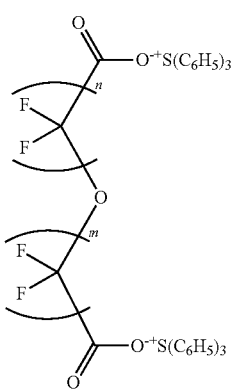

wherein n is 1, 2, or 3 and m is 1, 2, or 3

(2)

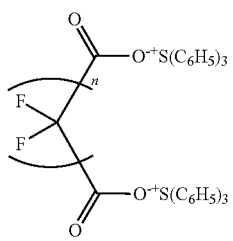

wherein n is 1, 2, or 3

(3)

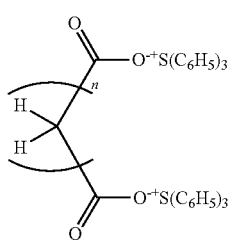

wherein n is 1, 3, or 4

(4)

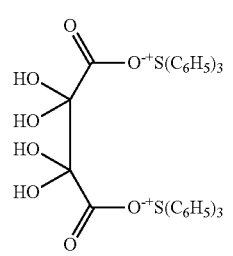

(5)

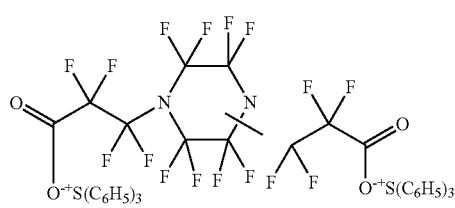

(6)

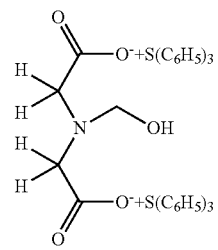

(7)

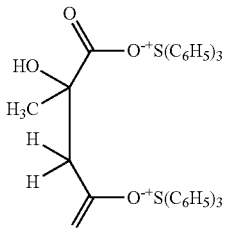

(8)

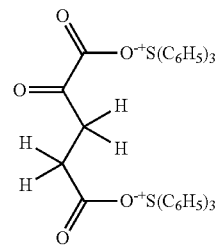

(9)

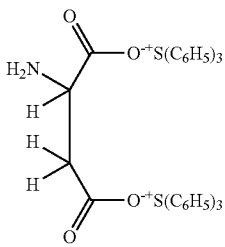

(10)

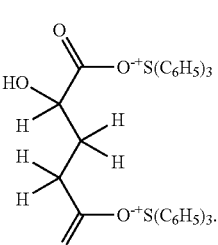

In another embodiment, the casting solvent of step (a) is selected from the group consisting of propylene glycol methyl ether acetate (PGMEA), propylene glycol monomethylether (PGME), and a combination of PGMEA and PGME.

In a further embodiment, the radiation of step (d) is selected from the group consisting of deep ultraviolet (DUV) radiation, extreme ultraviolet (EUV) radiation, electron beam (e-beam) radiation, and ion-beam radiation.

Additional aspects and embodiments of the invention will be provided, without limitation, in the detailed description of the invention that is set forth below.

BRIEF DESCRIPTION OF THE DRAWINGS

FIG. 8 also shows methacrylate Hd-MCpMA resists developed with EG/IPA (70/30 and 50/50).

FIG. 9 also shows methacrylate Hd-MCpMA resists developed with EG/IPA (70/30 and 50/50).

FIG. 11 also shows the methacrylate HdMCpMA resist developed with glycerol/IPA (50/50).

DETAILED DESCRIPTION OF THE INVENTION

Figure 1:
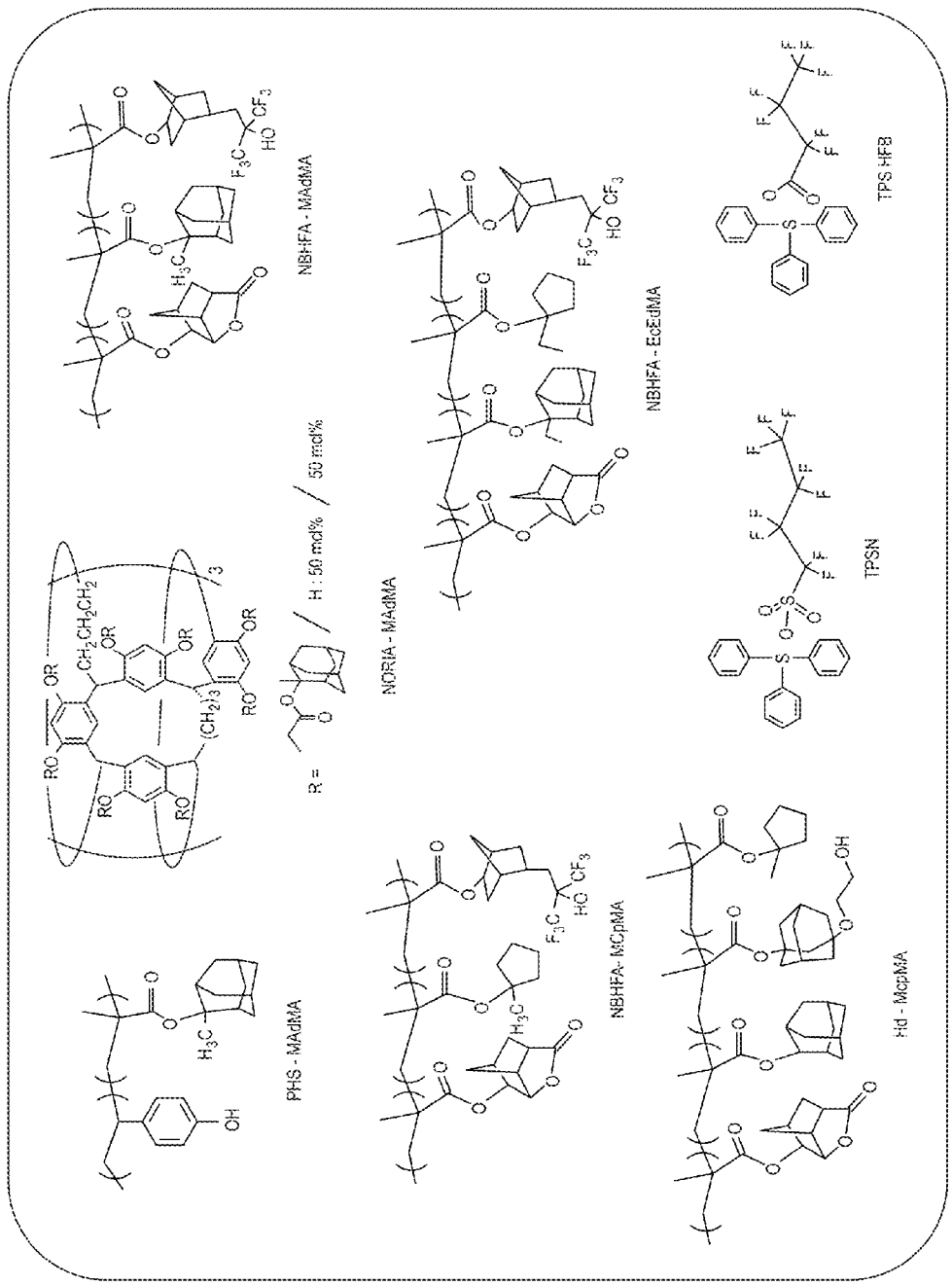
FIG. 1 shows structures for the photoresist compositions developed according to the methods of the present invention with the following solvents: ethylene glycol (EG), EG/isopropyl alcohol (IPA), and EG/water, and glycerol/IPA.

Set forth below is a description of what are currently believed to be preferred embodiments of the claimed invention. Any alternates or modifications in function, purpose, or structure are intended to be covered by the claims of this application. As used in this specification and the appended claims, the singular forms "a," "an," and "the" include plural referents unless the context clearly dictates otherwise. The terms "comprises" and/or "comprising," as used in this specification and the appended claims, specify the presence of stated features, integers, steps, operations, elements, and/or components, but do not preclude the presence or addition of one or more other features, integers, steps, operations, elements, components, and/or groups thereof.

As used herein, the terms "resist" and "photoresist" are meant to refer to the same composition and thus, the terms are used interchangeably herein.

The term "negative tone resist" refers to a photoresist that produces a negative tone image upon development, i.e., unexposed regions are removed during the development process.

The terms "positive tone resist" refers to a photoresist that produces a positive tone image upon development, i.e., exposed regions are removed during the development process.

The term "polyhydric alcohol" is used in its traditional sense to refer to an alcohol molecule that has more than one hydroxyl group.

The term "DUV" or "deep ultraviolet" refers to radiation at wavelengths of 300 nm or shorter, with typical DUV exposure wavelengths for lithography techniques being 248 nm (5 eV) with krypton fluoride (KrF) excimer lasers and 193 nm (6.4 eV) with argon fluoride (ArF) excimer lasers.

The term "EUV" or "extreme ultraviolet" refers to radiation at wavelengths of 50 nm or shorter. Typical EUV exposure currently occurs at 10 to 13 nm with 13.5 nm being the most commonly used EUV wavelength.

The term "chemically amplified resist" is used in its traditional sense to refer to a photoresist that is based on acid-catalyzed deprotection and is comprised of a polymer, catalyst, additive, and casting solvent. Chemically amplified resists are designed for DUV and shorter wavelengths and have increased sensitivity to exposure energy as a consequence of the chemical amplification.

The present invention is directed to the use of an organic developer solvent comprising a polyhydric alcohol to develop high resolution positive tone images in chemically amplified resists. The polyhydric alcohol based developer solvent will necessarily have hydroxide ions in the range of zero to $2.6 \times 10^{-4}$ M. In one embodiment, the solvent has no more than $1.0 \times 10^{-4}$ M hydroxide ions and in another embodiment, the solvent is free of hydroxide ions.

Examples of polyhydric alcohols that may be used to prepare the developer solvent of the present invention include, without limitation, ethylene glycol, glycerol, erythritol, threitol, arabitol, xylitol, ribitol, mannitol, sorbitol, galactitol, fucitol, iditol, inositol, volemitol, isomalt, maltitol, lactitol, maltotriitol, maltotetraitol, polyglycidol. The polyhydric alcohol may be used alone (i.e., neat) to develop the positive tone resist or it be used in combination with water or with other solvents, such as for example, aliphatic alcohols, diols, and/or triols. A preferred organic solvent for use with the organic polyhydric alcohol solvent of the present invention is isopropyl alcohol. Examples of other organic solvents that may be used in combination with the organic polyhydric alcohol solvent of the present invention include, without limitation, propanediols, propanetriols, butanediols, butanetriols, pentanediols, pentanetriols, hexanediols, hexanetriols, octanediols, octanetriols, cyclopropanol, cyclobutanol, cyclopentanol, phenylmethanol, and phenylethanol. One of skill in the art will appreciate that the formulation of the organic solvent developer of the present invention will be set in such a way as to optimize the RLS response of the resist. The RLS response may be optimized by comparing the LER of the resist, at a given resolution and imaging dose, after development with an aqueous base and with the organic developer solvent of the present invention.

The positive tone chemically amplified resists described herein may be prepared from resist polymers selected from the group consisting of molecular glasses, polyhydroxystyrenes, styrenes having one or more pendant hexafluoroalcohol groups, acrylates, methacrylates, and methacrylate fluoroalcohols. An example of a molecular glass resist polymer that may be used to prepare a positive tone molecular glass resist is NORIA molecular glass protected with 2-methyl-2-adamantyl methacrylate (NORIA-MAdMA). An example of a polyhydroxystyrene (PHS) resist polymer that may be used to prepare a positive tone PHS resist is poly(4-hydroxystyrene-co-2-methyl-2-adamantyl methacrylate) (PHS-MAdMA). An example of a methacrylate resist polymer that may be used to prepare a methacrylate resist is poly((1-methylcyclopentyl methacrylate)-co-(2-methyltricyclo[3.3.1.13,7]decan-2-yl methacrylate)-co-(3-(2-hydroxyethoxy)tricyclo[3.3.1.13,7]decan-1-yl methacrylate)-co-(4-oxa-5-oxotricyclo[4.2.1.03,7]nonan-2-yl methacrylate)) (Hd-MCpMA). Examples of methacrylate-fluoroalcohol resist polymers that may be used to prepare methacrylate-fluoroalcohol resists include poly(5-acryloyloxy-2,6-norbornanecarbolactone-co-2-methyl-2-adamantyl methacrylate-co-2-[1',1',1'-trifluoro-2'-(trifluoromethyl)-2'-hydroxy)propyl-3-norbornyl methacrylate) (NBHFA-MAdMA); poly(5-acryloyloxy-2,6-norbornanecarbolactone-co-2-methyl-2-cyclopentayl methacrylate-co-2-[1',1',1'-trifluoro-2'-(trifluoromethyl)-2'-hydroxy)propyl-3-norbornyl methacrylate) (NBHFA-MCpMA); and poly(5-acryloyloxy-2,6-norbornanecarbolactone-co-2-ethyl-2-cyclopentayl methacrylate-co-2-ethyl-2-adamantyl methacrylate-co-2-[1', 1',1'-trifluoro-2'-(trifluoromethyl)-2'-hydroxy)propyl-3-norbornyl methacrylate) (NBHFA-EcEdMA).

Preparation of the positive tone organic solvent developed chemically amplified resists described herein involves the generation of acidic substituent groups, such as carboxylic acids or phenols, which render the exposed areas of the resist soluble in polar organic solvents while the unexposed film remains insoluble. The polarity differences between the exposed and unexposed regions of the film cause the dissolution contrast of the organic solvent developed positive tone photoresists of the present invention. This type of polarity based dissolution differs from the ionization-dissolution that occurs in aqueous base developed resists, a process that is more akin to chemical etching than the polymer solubilization that occurs with solvent development. As the presence of hydroxide ions in the developer solvent risks the introduction of ionization/dissolution processes, rather than the polarity based dissolution described herein, it is preferred that the developer solvent of the present invention has a concentration of hydroxide ions that is as low as possible.

The polarity based dissolution describes herein also differs from the dissolution process that occurs in non-chemically amplified resists, such as PMMA resists, where the dissolution contrast derives from changes in molecular weight and is typically very poor due to the chemical similarity of the exposed and unexposed regions of the resist film.

As a result of the improved polarity-based dissolution process described herein, the positive tone organic solvent developed chemically amplified resists of the present invention have the potential to address RLS challenges in a way that other resist development systems cannot. For example, the resists and methods of the present invention overcome problems that are caused when alkaline developers are used for non-semiconductor lithographic processes, such as the fabrication of chips patterned with arrays of biomolecules (e.g., proteins and oligonucleotides).

FIGS. 2-12 show imaging results and contrast curve data for positive tone resists developed with ethylene glycol (EG) alone, isopropyl alcohol (IPA) alone, EG in combination with IPA, glycerol in combination with IPA, and EG in combination with water. Positive tone resists developed with TMAH are included for comparative purposes.

FIGS. 2, 4, 5, 7, and 10 show scanning electron micrograph (SEM) imaging results for styrenic molecular glass (FIGS. 2, 4, 5), polyhydroxystyrene (FIG. 7), and methacrylate-fluoroalcohol (FIG. 10) based positive tone resists, which were developed with the organic solvent method of the present invention. Examples 2, 4, 5, 7, and 10 describe the experimental procedures associated with the generation of the SEM images.

FIGS. 2A-2D show SEM line/space (LS) patterns at 200 nm critical dimension (CD) for high performance positive tone NORIA-MAdMA molecular glass resists imaged with a KrF excimer laser and developed with the following solvents: IPA (100), EG (100), EG/IPA (70/30), and EG/water (90/10). FIGS. 2A-2D clearly show that the NORIA-MAdMA resists developed with the solvents containing EG show far greater contrast images than the resist developed with IPA alone.

Figure 4A:
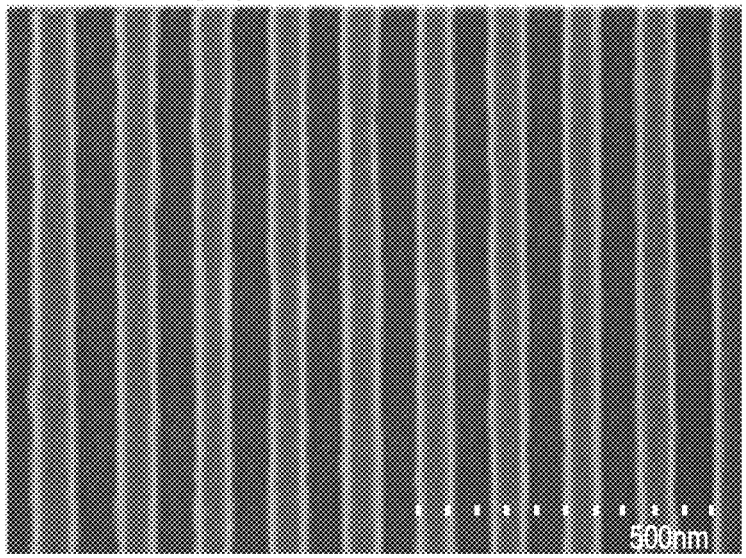
FIGS. 4A-4D show e-beam imaging results for molecular glass NORIA-MAdMA resists developed with TMAH (0.26N) and EG (100).
Figure 4B:
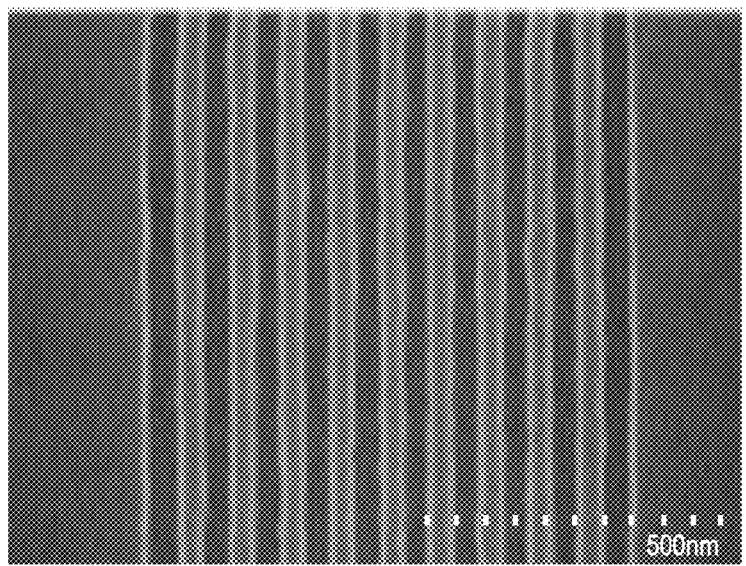
Figure 4C:
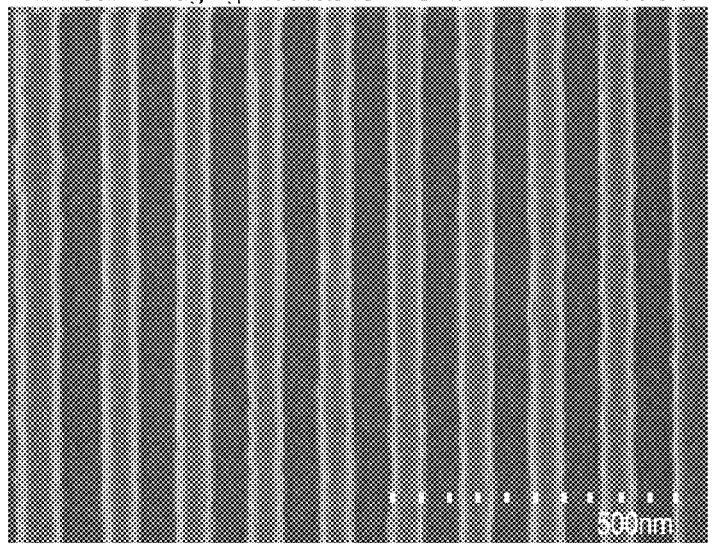
Figure 4D:
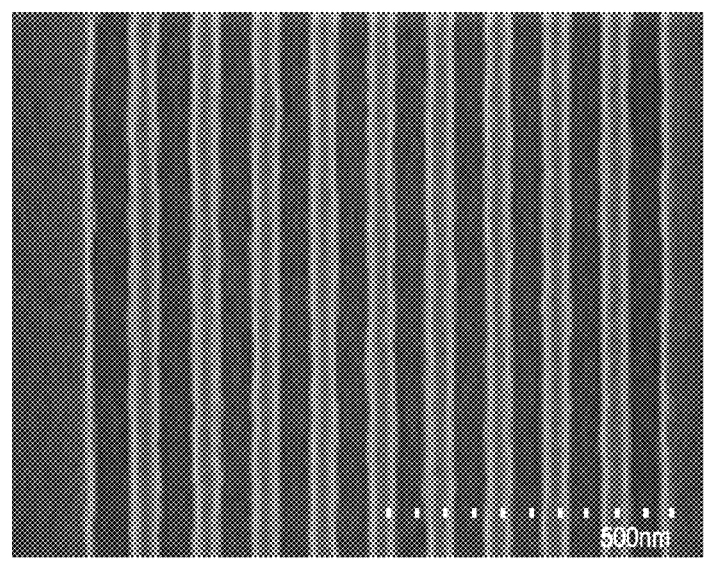

FIGS. 4A-4D show SEM L/S patterns at 40 nm and 60 nm CD for NORIA MAdMA positive tone resists imaged with e-beam radiation and developed with either 0.26 N TMAH standard base (FIGS. 4A and 4B) or 100% EG (FIGS. 4C and 4D). FIGS. 4A-4D show that the EG solvent of the present invention is equally as effective at developing positive tone resists as the standard TMAH solvent.

Figures 5A, 5B, 5C:
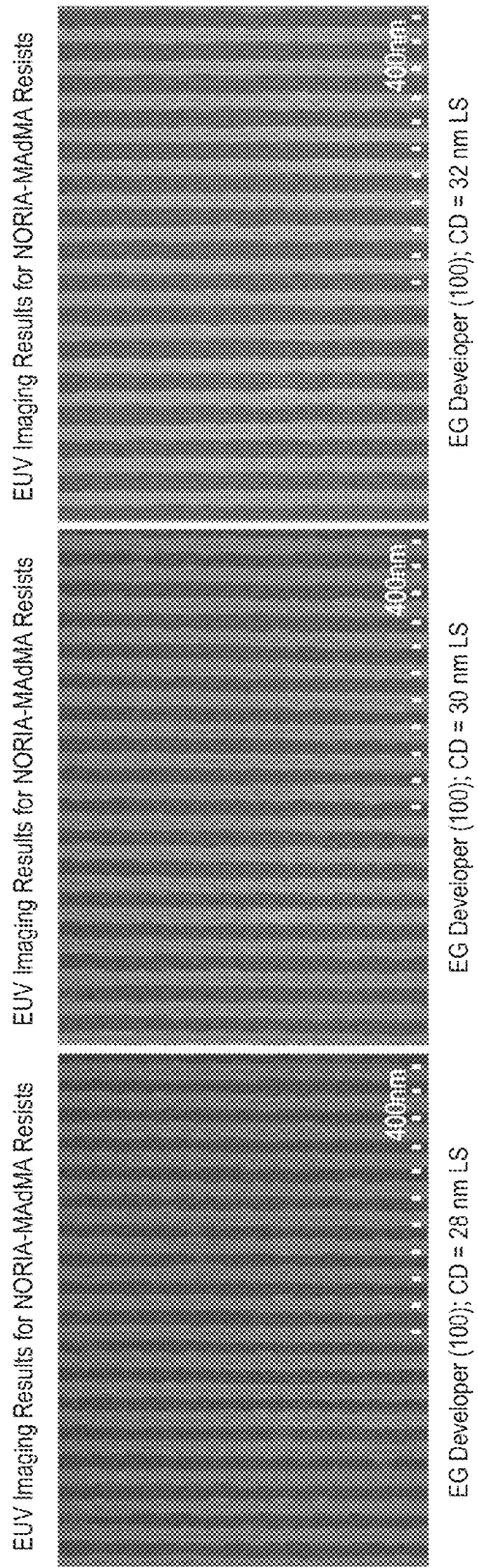
FIGS. 5A-5C show EUV imaging results for molecular glass NORIA-MAdMA resists developed with EG (100).

FIGS. 5A-5C show SEM L/S patterns at 28 nm, 30 nm, and 32 nm CD for NORIA-MAdMA positive tone resists imaged with EUV radiation and developed with EG (100).

Figure 7A:
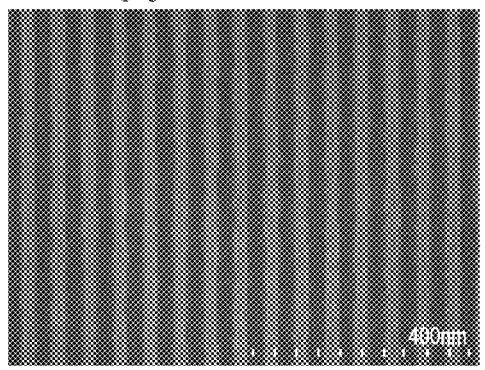
FIGS. 7A and 7B show EUV imaging results for polyhydroxystyrene PHS-MAdMA resists developed with EG (100).
Figure 7B:
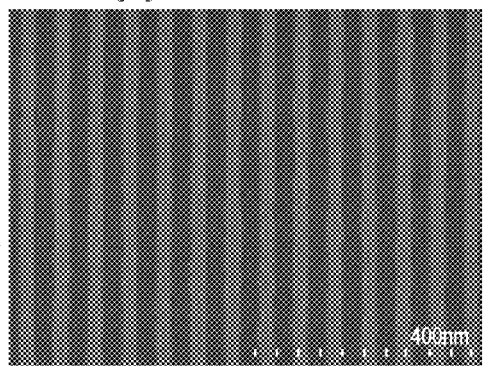

FIGS. 7A and 7B show SEM L/S patterns at 32 nm and 36 nm CD for PHS-MAdMA polyhydroxystyrene positive tone resists imaged with EUV radiation and developed with EG.

FIGS. 10A-10C show SEM L/S patterns at 30 nm, 32 nm, and 36 nm CD for NBHFA-MAdMA/NBHFA-MCpMA (10/90) methacrylate-fluoroalcohol positive tone resists imaged with EUV radiation and developed with an EG/IPA (70/30).

FIGS. 3, 6, 8, 9, 11, and 12 show contrast curve data for styrenic molecular glass (FIGS. 3 and 12), polyhydroxystyrene (FIG. 6), and methacrylate and methacrylate-fluoroalcohol (FIGS. 8, 9, and 11) based positive tone resists, which were developed using the organic solvent method of the present invention. Examples 3, 6, 8 and 9 describe the experimental procedures associated with the generation of the contrast curve data.

Figure 3:
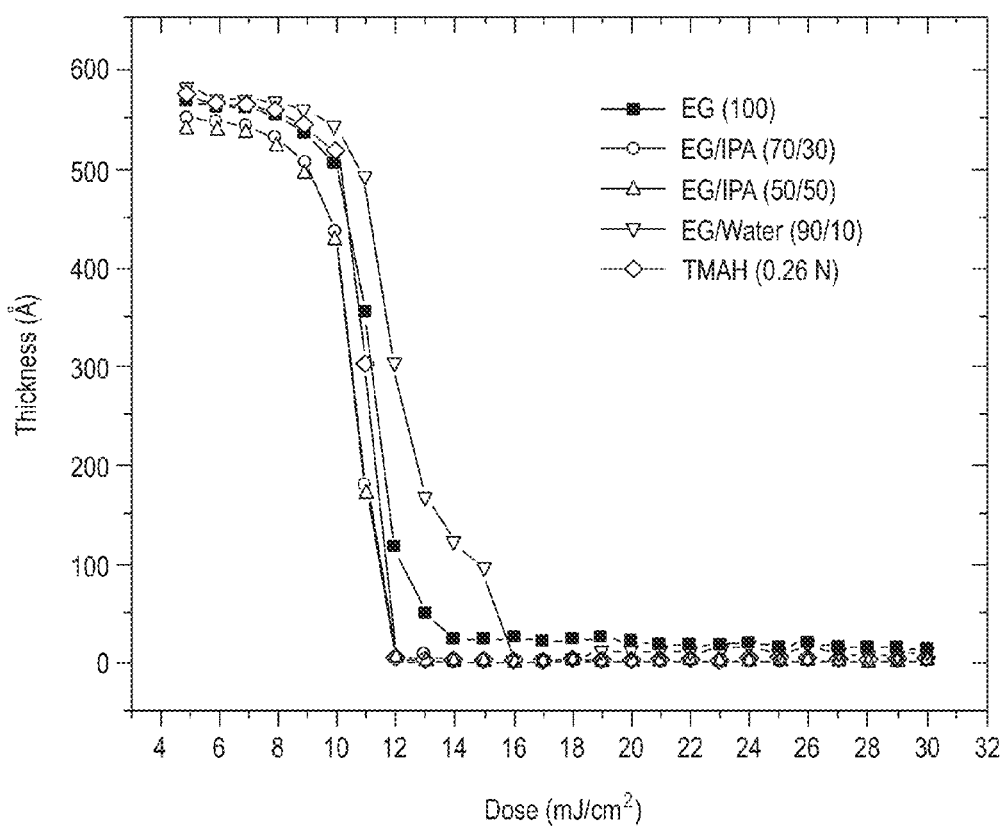
FIG. 3 shows KrF contrast curve data for molecular glass NORIA-MAdMA resists developed with EG (100); EG/IPA (70/30 and 50/50); EG/water (90/10); and tetramethyl ammonium hydroxide (TMAH 0.26N).

FIG. 3 shows KrF contrast curve data for positive tone NORIA-MAdMA molecular glass resists developed with EG (100), EG/IPA (70/30), EG/IPA (50/50), EG/water (90/10), and 0.26 N TMAH for comparative purposes. As shown therein, the NORIA-MAdMA resists were developed into very high contrast resists suitable for high performance imaging with all solvents. The EG neat and EG/IPA (both 70/30 and 50/50) developers produced resists with contrast data comparable to that of the TMAH developed resists. The EG/water (90/10) developer produced resists with lightly less contrast than EG/IPA and TMAH developed resists.

Figure 12:
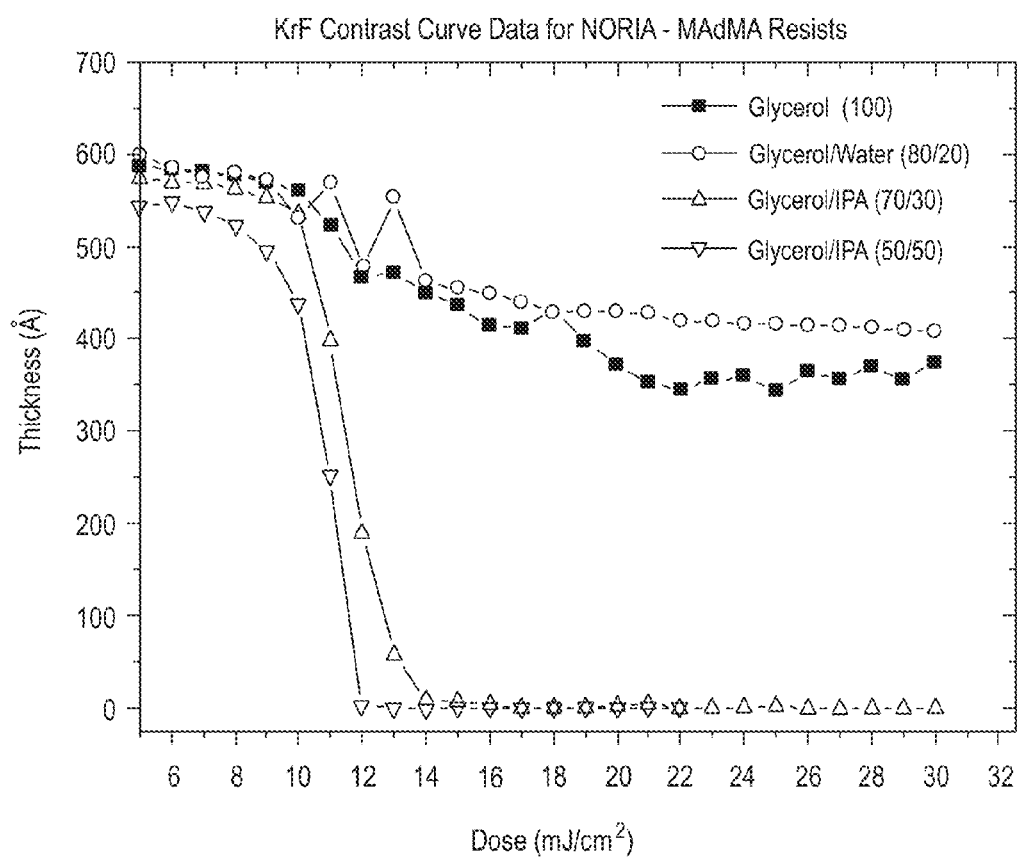
FIG. 12 shows KrF contrast curve data for NORIA-MAdMA resists developed with glycerol (100), glycerol/water (80/20), glycerol/IPA (70/30), and glycerol/IPA (50/50).

FIG. 12 shows KrF contrast curve data for positive tone NORIA-MAdMA molecular glass resists developed with glycerol (100), glycerol/water (80/20); glycerol/IPA (70/30); and glycerol/IPA (50/50). As shown therein, the neat glycerol and glycerol/water solvents did not produce high contrast resists whereas the glycerol/IPA solvents produced very high contrast positive tone molecular glass resists.

Figure 6:
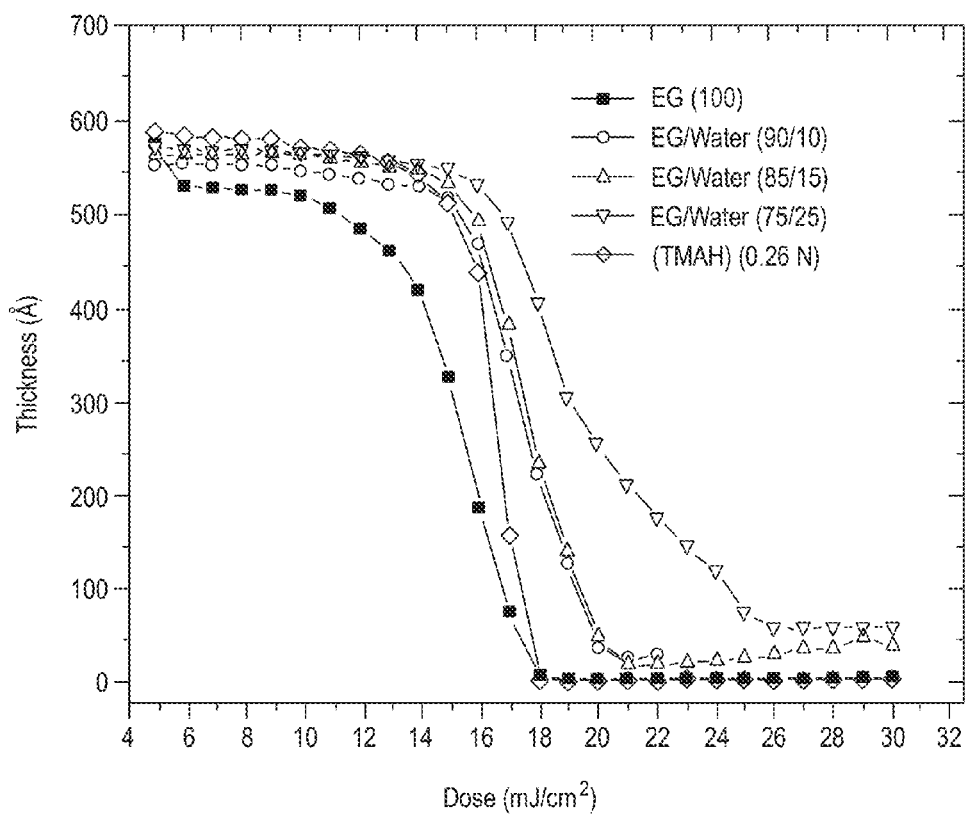
FIG. 6 shows KrF contrast curve data for polyhydroxystyrene PHS-MAdMA resists developed with EG (100); EG/water (90/10, 85/15, and 75.25); and TMAH (0.26N).

FIG. 6 shows KrF contrast curve data for positive tone PHS-MAdMA polyhydroxystyrene positive tone resists developed with EG, EG/water (90/10), EG/water (85/15), EG/water (75/25), and TMAH for comparative purposes. The EG neat developer produced the highest contrast PHS resist from among the tested developers.

Figure 8:
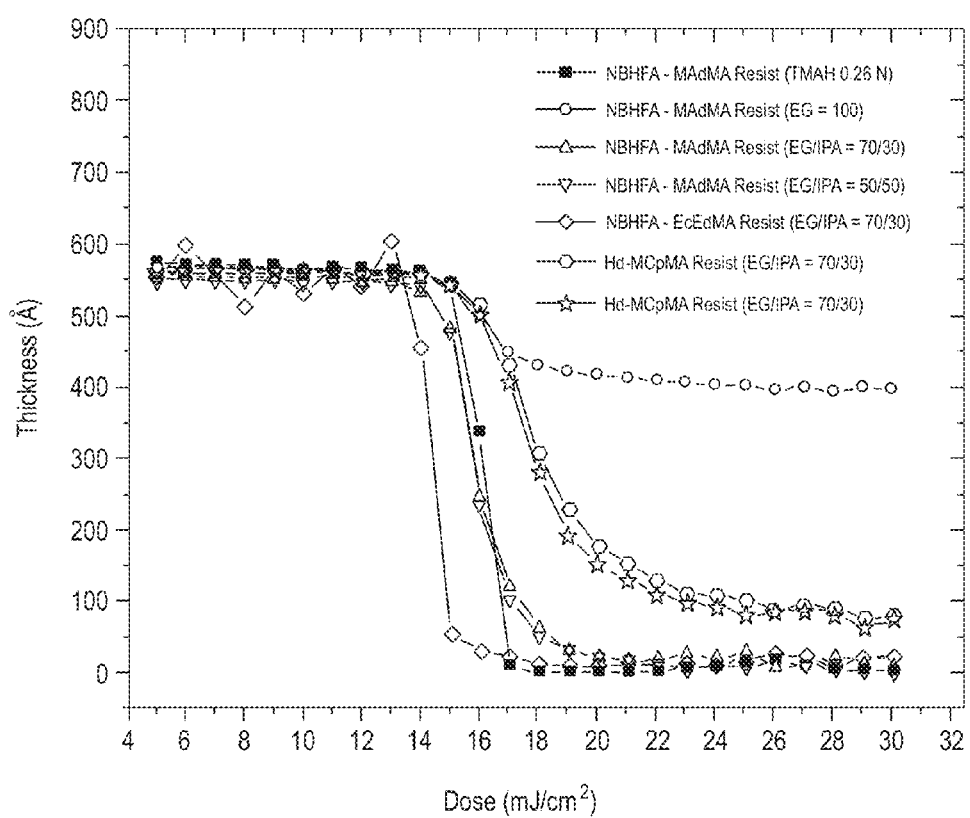
FIG. 8 shows KrF contrast curve data for methacrylate-fluoroalcohol NBHFA-MAdMA and NBHFA-EcEdMA resists developed with TMAH (0.26N), EG (100), and EG/IPA (70/30 and 50/50).

FIG. 8 shows KrF contrast curve data for NBHFA-MAdMA and NBHFA-EcEdMA methacrylate-fluoroalcohol positive tone resists developed with 0.26 N TMAH (for comparative purposes), EG (100), and EG/IPA (70/30 and 50/50). Optimization of the EG neat developer to incorporate IPA increased the contrast for the NBHFA-MAdMA resist to where it was comparable or better than that seen with TMAH.

FIG. 8 also shows KrF contrast curve data for the HdMCpMA methacrylate positive tone resist; this resist showed comparable contrast at both EG/IPA (70/30) and EG/IPA 50/50).

Figure 9:
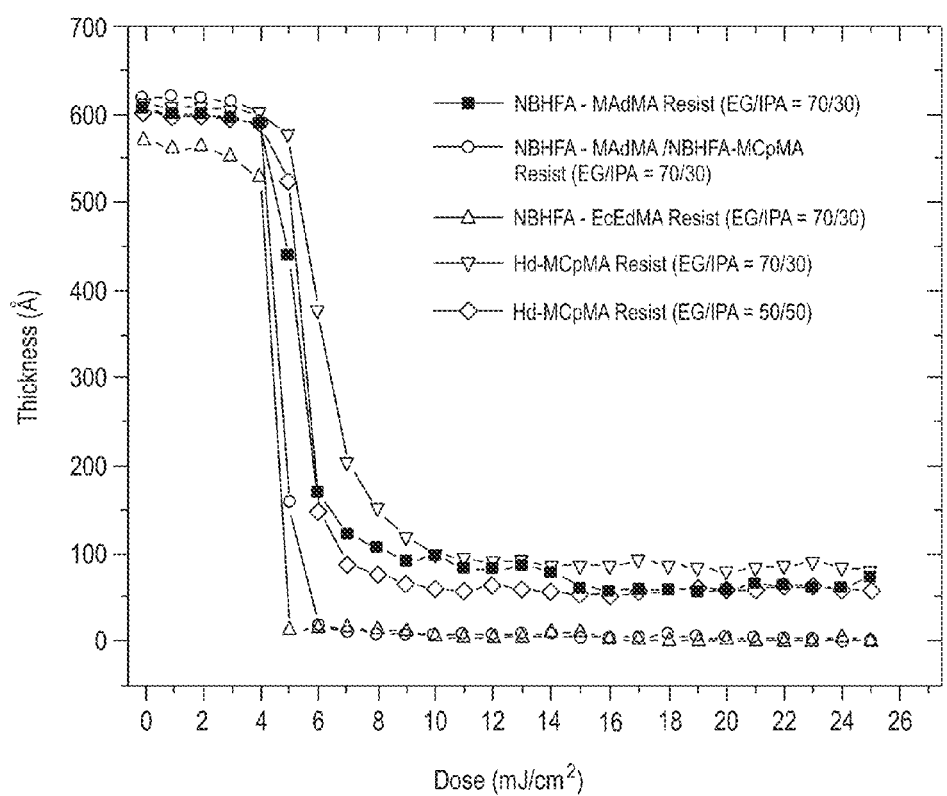
FIG. 9 shows ArF contrast curve data for methacrylate-fluoroalcohol NBHFA-MAdMA, NBHFA-MAdMA/NBHFA-MCpMA (10/90), and NBHFA-EcEdMA resists developed with EG/IPA (70/30).
Figure 10:
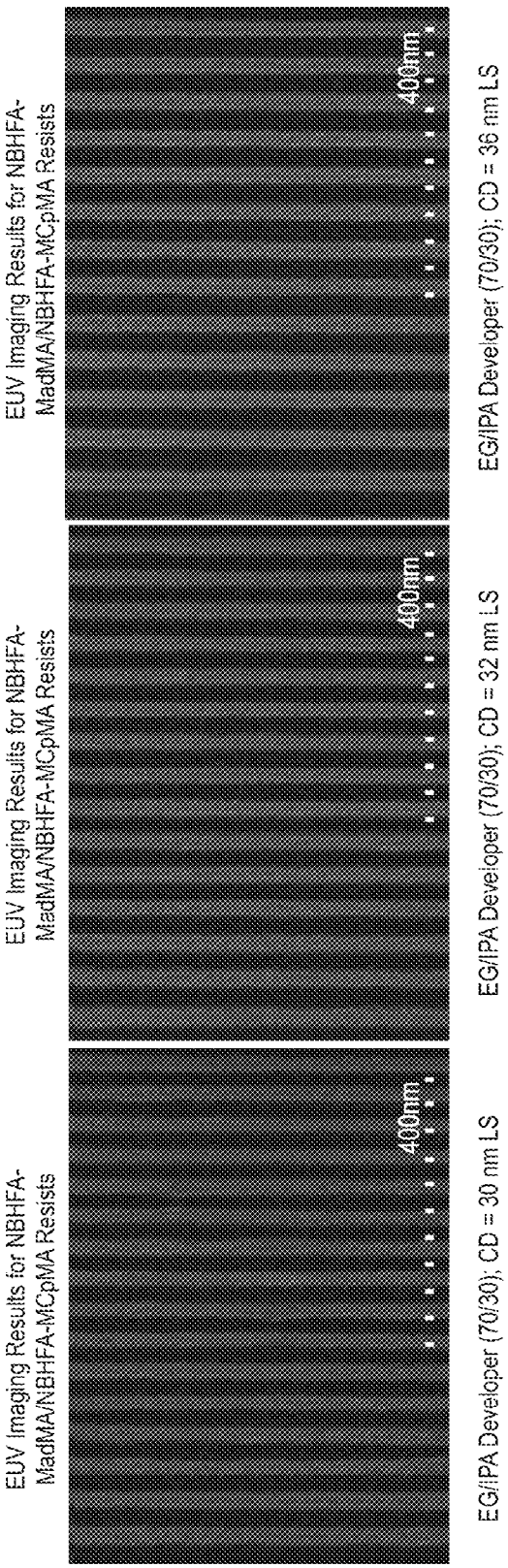
FIGS. 10A-10C show EUV imaging results for methacrylate-fluoroalcohol NBHFA-MAdMA/NBHFA-MCpMA (10/90) resists developed with EG/IPA (70/30).

FIG. 9 shows ArF contrast curve data for NBHFA-MAdMA, NBHFA-MAdMA/NBHFA-MCpMA (10/90), and NBHFA-EcEdMA methacrylate-fluoroalcohol positive tone resists developed with EG/IPA (70/30) as well as ArF contrast curve data for Hd-MCpMA methacrylate positive tone resists developed with EG/IPA (70/30) and EG/IPA (50/50). FIG. 9 illustrates that developer optimization may differ slightly for different resist polymers. As shown therein, the EG/IPA (70/30) developer produced methacrylate-fluoroalcohol resists with excellent contrast while the EG/IPA (50/50) developer produced methacrylate resists with improved contrast over those produced with the EG/IPA (70/30) developer.

Figure 11:
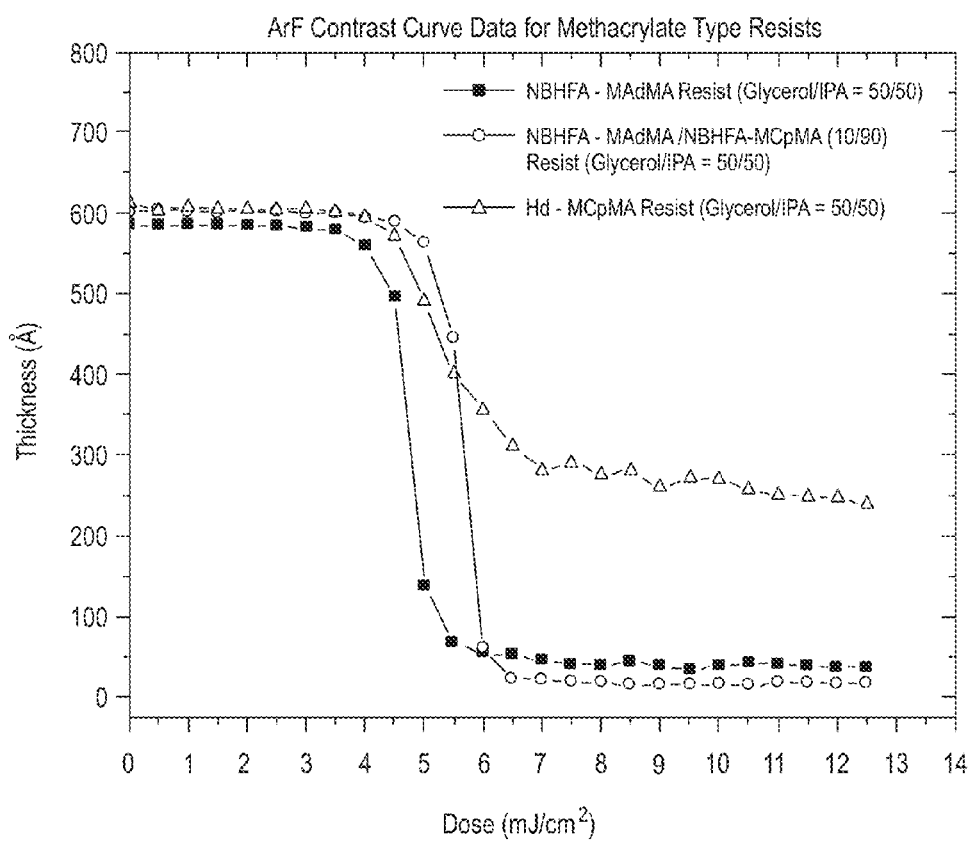
FIG. 11 shows ArF contrast curve data for methacrylate-fluoroalcohol NFHFA-MAdMA and NBHFA-MAdMA/NBHFA-MCpMA (10/90) resists developed with glycerol/IPA (50/50).

FIG. 11 shows ArF contrast curve data for NBHFA-MAdMA and NBHFA-MAdMA/NBHFA-MCpMA (10/90) methacrylate-fluoroalcohol positive tone resists developed with glycerol/IPA (50/50) as well as ArF contrast curve data for Hd-MCpMA methacrylate positive tone resists developed with glycerol/IPA (50/50). While the glycerol/IPA developer produced high contrast methacrylate-fluoroalcohol resists, the glycerol/IPA developer failed to produce a suitable methacrylate resist. The data from FIG. 11 indicates that optimization of the solvent with a different polyhydric alcohol, organic solvent, and/or water concentration may be necessary to improve the contrast of the resulting methacrylate resist (similar to that seen in FIG. 12).

The organic solvent developed positive tone resists of the present invention are prepared as follows: (a) the positive tone resist polymer (see e.g., Table 1) is dissolved in a casting solvent; (b) the dissolved composition is coated on a substrate to produce a resist film; (c) optionally, the resist film is baked to drive off the casting solvent (the post-application bake or PAB); (d) the film is exposed to radiation; (e) optionally, the film is baked (post-exposure bake or PEB); (f) the film is developed with the organic developer solvent described herein; and (g) optionally, after development, the film is rinsed with water.

Examples of casting solvents that may be used to dissolve the positive tone resist polymers include, without limitation, propylene glycol methyl ether acetate (PGMEA), propylene glycol monoethyl ether (PGME), or a combination of PGMEA and PGME. One of skill in the art will appreciate that any other casting solvents used in the semiconductor arts may be substituted for any of the foregoing.

Examples of substrates that may be used to prepare the resist films include, without limitation, silicon (Si), gallium arsenide (GaAs), indium phosphide (InP), glass, and metals, such as gold (Au), copper (Cu), and aluminum (Al). One of skill in the art will appreciate that any other substrates used in the semiconductor arts may be substituted for any of the foregoing.

Exposure of the organic solvent developed positive tone photoresist of the present invention may occur by any suitable method including without limitation, DUV radiation, EUV radiation, ion-beam projection, x-ray radiation, e-beam radiation, and focused beam radiation.

After exposure, the positive tone photoresist is developed by contacting the photoresist layer with the organic polyhydric alcohol-based solvent disclosed herein to selectively dissolve the areas of the photoresist that were exposed to radiation. The unexposed areas of the photoresist remain intact to produce the positive tone image. The resulting lithographic structure on the substrate is then typically dried to remove any remaining developer. If a top coat has been used, it can be dissolved by the developer in this step.

It is to be understood by those of skill in the art that the PAB and PEB temperatures involved with the processing of the positive tone resists will vary with the materials and radiation that are used to carry out the method. For EUV exposure, typical PAB and PEB temperatures and bake times range from 50° C. to 150° C. for 30 to 200 seconds, with preferred temperatures and bake times ranging from 100 to 130° C. for 60 to 120 seconds. PAB temperatures will sometimes, but not necessarily, be higher than PEB temperatures and PEB bake times will sometimes, but not necessarily, be longer than PAB bake times.

In one embodiment, a suitable PAG may be used in the processing of the organic solvent developed positive tone resists of the present invention. The PAG present in the composition is typically in the range of about 1-15 mol % and may or may not be bound to the polymer. Those of skill in the art will appreciate that any PAG incorporated into the resists described herein should have high thermal stability, i.e., be stable to at least 140° C., so they are not degraded during pre-exposure processing.

Examples of PAGs that may be used with the positive-tone resists of the present invention include, without limitation, sulfonates, onium salts, aromatic diazonium salts, sulfonium salts, diaryliodonium salts and sulfonic acid esters of N-hydroxyamides or N-hydroxyimides. Specific examples of typical PAGs may be selected from the following list of PAGs:

(1) sulfonium salts, such as triphenylsulfonium perfluoro-1-butanesulfonate (TPS-N), triphenylsulfonium perfluoromethanesulfonate (triphenylsulfonium triflate), triphenylsulfonium perfluoropentanesulfonate, triphenylsulfonium hexafluoroantimonate, triphenylsulfonium hexafluoroarsenate, triphenylsulfonium hexafluorophosphate, triphenylsulfonium bromide, triphenylsulfonium chloride, triphenylsulfonium iodide, 2,4,6-trimethylphenyldiphenylsulfonium perfluorobutanesulfonate, 2,4,6-trimethylphenyldiphenylsulfonium benzenesulfonate, diphenylethylsulfonium chloride, and phenacyldimethylsulfonium chloride;

(2) halonium salts, particularly iodonium salts, including diphenyliodonium perfluoromethanesulfonate (diphenyliodonium triflate), diphenyliodonium perfluorobutanesulfonate, diphenyliodonium perfluoropentanesulfonate, diphenyliodonium hexafluoroantimonate, diphenyliodonium hexafluoroarsenate, bis-(t-butylphenyl)iodonium triflate, and bis-(t-butylphenyl)-iodonium camphanylsulfonate;

(3) $\alpha,\alpha'$-bis-sulfonyl-diazomethanes such as bis(p-toluenesulfonyl)diazomethane, methylsulfonyl p-toluenesulfonyldiazomethane, 1-cyclohexylsulfonyl-1-(1,1-dimethylethylsulfonyl)diazomethane, and bis(cyclohexylsulfonyl) diazomethane;

(4) trifluoromethanesulfonate esters of imides and hydroxyimides, e.g., $\alpha$-(trifluoromethylsulfonyloxy)-bicyclo [2.2.1]hept-5-ene-2,3-dicarboximide (MDT);

(5) nitrobenzyl sulfonate esters such as 2-nitrobenzyl p-toluenesulfonate, 2,6-dinitrobenzyl p-toluenesulfonate, and 2,4-dinitrobenzyl p-trifluoromethylbenzene sulfonate;

(6) sulfonyloxynaphthalimides such as N-camphorsulfonyloxynaphthalimide and N-pentafluorophenylsulfonyloxynaphthalimide;

(7) pyrogallol derivatives (e.g., trimesylate of pyrogallol);

(8) naphthoquinone-4-diazides;

(9) alkyl disulfones;

(10) s-triazine derivatives, as described in U.S. Pat. No. 4,189,323; and

(11) miscellaneous sulfonic acid generators including t-butylphenyl-$\alpha$-(p-toluenesulfonyloxy)-acetate, t-butyl-$\alpha$-(p-toluenesulfonyloxy)acetate, and N-hydroxy-naphthalimide dodecane sulfonate (DDSN), and benzoin tosylate.

Other suitable photoacid generators are disclosed in Reichmanis et al., *Chemistry of Materials* 3:395 (1991).

In another embodiment, a quencher may be used in the processing of the organic solvent developed positive tone resists of the present invention. The quencher may be a base quencher or a radiation sensitive quencher, such as a photodecomposable base (PDB).

Examples of base quenchers that may be used with the present invention include, without limitation, aliphatic amines, aromatic amines, and combinations thereof. Specific examples of base quenchers include, without limitation, 2-phenyl benzimidazole; tert-butyl 2-phenyl-1,3-benzodiazole-1-carboxylate; dimethylamino pyridine; 7-diethylamino-4-methyl coumarin (Coumarin 1); tertiary amines; sterically hindered diamine and guanidine bases, such as 1,8-bis(dimethylamino)naphthalene (e.g., PROTON SPONGED); berberine; and polymeric amines (such as in the PLURONIC® or TETRONIC® series commercially available from BASF). Tetra alkyl ammonium hydroxides or cetyltrimethyl ammonium hydroxide may be used as a base quencher when the PAG is an onium salt.

Examples of PDBs that may be used with the present invention include, without limitation, arylsulfonium or iodonium salts of carboxylates, hydroxides, and sulfamates. An example of a monofunctional PDB that can be used with the present invention is triphenylsulfonium heptafluorobutyrate (TPS-HFB). Additional PDBs that may be used with the present invention are described in commonly owned patent application Ser. No. 13/219,599 to Ayothi et al and include fluorinated bifunctional PDBs, asymmetrical PDBs, and dicarboxylate anion PDBs.

Examples of fluorinated bifunctional PDBs that may be used with the present invention include Structures 1, 2, and 5:

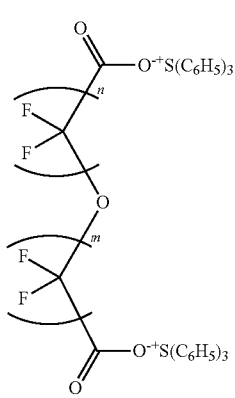

(1)

wherein n is 1, 2, or 3 and m is 1, 2, or 3

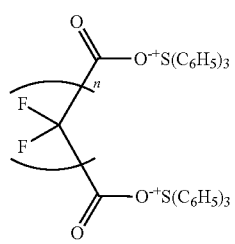

(2)

wherein n is 1, 2, or 3

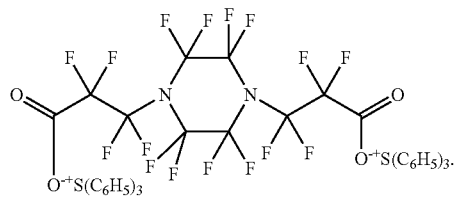

(5)

Examples of asymmetrical PDBs that may be used with the present invention include Structures 7-10:

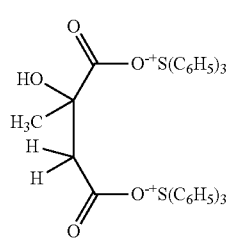

(7)

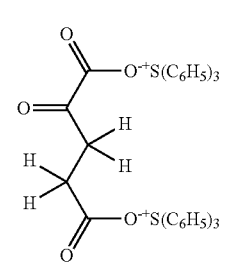

(8)

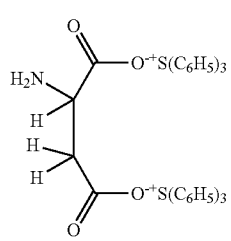

(9)

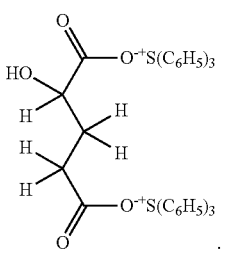

(10)

Examples of dicarboxylate anion PDBs that may be used with the present invention include Structures 3, 4, and 6:

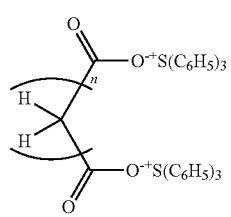

(3)

wherein n is 1, 3, or 4

-continued

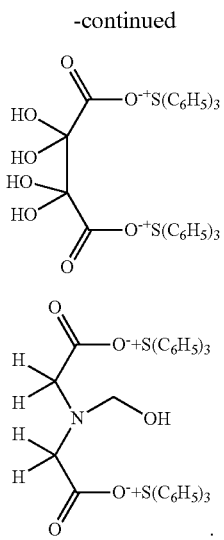

(4)

(6)

The organic solvent developed positive tone chemically amplified resists described herein have utility in a number of applications. For example, they may be used to manufacture semiconductor devices, such as integrated circuits. As noted above, they may also be useful for applications where basic solvents are not suitable, such as the fabrication of chips patterned with arrays of biomolecules or deprotection applications that do not require the presence of acid moieties.

It is to be understood that while the invention has been described in conjunction with the embodiments set forth above, the foregoing description as well as the examples that follow are intended to illustrate and not limit the scope of the invention. Further, it is to be understood that the embodiments and examples set forth herein are not exhaustive and that modifications and variations of the invention will be apparent to those of ordinary skill in the art without departing from the scope and spirit of the invention.

All patents and publications mentioned herein are incorporated by reference in their entireties.

EXPERIMENTAL

The following examples are set forth to provide those of ordinary skill in the art with a complete disclosure of how to make and use embodiments of the invention as set forth herein. While efforts have been made to ensure accuracy with respect to variables, such as amounts, temperature, etc., experimental error and deviations should be taken into account. Unless indicated otherwise, parts are parts by weight, temperature is degrees centigrade, and pressure is at or near atmospheric.

All polymers used in the examples were synthesized in the laboratory using commercially available chemicals. The following materials were used in the examples:

NORIA molecular glass protected with 2-methyl-2-adamantyl methacrylate [NORIA-MAdMA, (50/50)] (resist polymer);
Poly(4-hydroxystyrene-co-2-methyl-2-adamantyl methacrylate) [PHS-MAdMA (60/40)] (resist polymer);
Poly(5-acryloyloxy-2,6-norbornanecarbolactone-co-2-methyl-2-adamantyl methacrylate-co-2-[1',1',1'-trifluoro-2'-(trifluoromethyl)-2'-hydroxy)propyl-3-norbornyl methacrylate) [NBHFA-MAdMA (40/15/45)] (resist polymer);
Poly(5-acryloyloxy-2,6-norbornanecarbolactone-co-2-methyl-2-cyclopentayl methacrylate-co-2-[1',1',1'-trifluoro-2'-(trifluoromethyl)-2'-hydroxy)propyl-3-norbornyl methacrylate) [NBHFA-MCpMA, (40/15/45)] (resist polymer);
Poly(5-acryloyloxy-2,6-norbornanecarbolactone-co-2-eethyl-2-cyclopentayl methacrylate-co-2-ethyl-2-adamantyl methacrylate-co-2-[1',1',1'-trifluoro-2'-(trifluoromethyl)-2'-hydroxy)propyl-3-norbornyl methacrylate) [NBHFA-EcEdMA] (resist polymer); and
Poly((1-methylcyclopentyl methacrylate)-co-(2-methyltricyclo[3.3.1.13,7]decan-2-yl methacrylate)-co-(3-(2-hydroxyethoxy)tricyclo[3.3.1.13,7]decan-1-yl methacrylate)-co-(4-oxa-5-oxotricyclo[4.2.1.03,7]nonan-2-yl methacrylate)) [Hd-MCpMA] (resist polymer).
Triphenylsulfonium perfluoro-1-butanesulfonate (TPS-N) (photoacid generator; PAG);
Triphenylsulfonium heptafluorobutyrate (TPS-HFB) (base quencher) was synthesized from triphenylsulfonium bromide and silver heptafluorobutyrate by anion exchange reaction.
DUV42P or ARC29A bottom anti-reflective coating (BARC) coated silicon wafers (substrate), obtained from Brewer Science, Inc. Rolla, Mo., USA;
Propylene glycol monomethylether acetate (PGMEA) (casting solvent), obtained from Sigma-Aldrich Corp., St. Louis, Mo., USA;
Propylene glycol monomethylether (PGME) (casting solvent) Aldrich; Ethylene Glycol (EG) (developer solvent), obtained from Sigma-Aldrich Corp., St. Louis, Mo., USA;
Glycerol (developer solvent), obtained from Sigma-Aldrich Corp., St. Louis, Mo., USA;
Isopropyl Alcohol (IPA) (developer solvent), obtained from Sigma-Aldrich Corp., St. Louis, Mo., USA;
0.26 N Tetramethyl ammonium hydroxide (TMAH) (developer), obtained from Fuji Film, Cypress, Calif., USA.
KrF excimer laser exposures (248 nm) were performed in an ASML 550/300D stepper (Annular; NA=0.61; $\sigma_{out}$=0.60; $\sigma_{out}$=0.35).
EUV exposures were performed with the Lawrence Berkeley National Laboratory SEMATECH® (Sematech Inc., Austin, Tex., USA) Micro-Exposure Tool (LBNL-MET) (Rotated Dipole; NA=0.3).
E-beam exposures were performed with a Leica VB6 lithography tool at 100 keV.
The following additional definitions are used in the Examples:
FT=film thickness;
Dev=development;
PAB=post-application bake; and
PEB=post-exposure bake.

EXAMPLE 1

Processing of Organic Solvent Developed Positive Tone Photoresists

Resist formulations were prepared by mixing the polymer or molecular glass (3 to 5 wt %) with the PAG TPS-N and the quencher TPS-HFB in PGMEA or a PGMEA/PGEME mixture. The PAG and the quencher concentration was 0.25 and 0.1 mmole per gram of polymer, respectively. The resist formulations were filtered through a 0.2 μm Teflon filter, spin coated onto a BARC coated substrate, and post-apply baked (PAB) at 110° C. for 60 seconds. After exposure, the wafer was put through PEB at 110° C. for 60 seconds, and developed in either aqueous base, TMAH (0.26 N), EG (100), EG/IPA (70/30 or 50/50), EG/Water (90/10), glycerol (100), or glycerol/IPA (70/30 or 50/50) for 30 to 120 seconds. Each wafer developed with TMAH or organic solvent was rinsed with water before drying.

Table 1 summarizes resist compositions that were prepared and evaluated using the foregoing procedure.

TABLE 1

RESIST FORMULATIONS

| RESIST TYPE | RESIST | POLYMER | PAG | QUENCHER | SOLVENT |
|---|---|---|---|---|---|
| Molecular Glass | NORIA-MAdMA | NORIA-MAdMA (100) | TPS-N (0.25M) | TPS-HFB (0.1M) | PGMEA |
| Polyhydroxy-styrene (PHS) | PHS-MAdMA | PHS-MAdMA (100) | TPS-N (0.25M) | TPS-HFB (0.1M) | PGMEA |
| Methacrylate-Fluoroalcohol | NBHFA-MAdMA | NBHFA-MAdMA (100) | TPS-N (0.25M) | TPS-HFB (0.1M) | PGMEA |
|  | NBHFA-MAdMA/NBHFA-MCpMA | NBHFA-MAdMA/NBHFA-MCpMA (10/90) | TPS-N (0.25M) | TPS-HFB (0.1M) | PGMEA |
|  | NBHFA-EcEdMA | NBHFA-EcEdMA (100) | TPS-N (0.25M) | TPS-HFB (0.1M) | PGMEA/PGME (20/80) |
| Methacrylate | Hd-MCpMA | Hd-MCpMA (100) | TPS-N (0.25M) | TPS-HFB (0.1M) | PGMEA |

Structures for the polymers and molecular glass compositions from Table 1 are shown in FIG. 1. Also shown in FIG. 1 are the structures for the TPS-N PAG and the TPS-HFB base quencher. The polymer percentages indicated in Table 1 apply to the polymers used in the following examples. In the following examples, the term "methacrylate-type" is used to refer to both methacrylate-fluoroalcohol and methacrylate resists.

EXAMPLE 2

KrF Imaging of NORIA-MAdMA Resists

Top-down SEM images for the KrF exposed NORIA-MAdMA resist of Table 1 are shown in FIGS. 2A-2D. The resists were prepared with the following materials and processing conditions: Resist composition=NORIA-MAdMA/TPS-N/TPS-HFB; Substrate=DUV42P; FT=80 nm; PAB=110° C./60 s; Exposure=KrF; PEB=110° C./60 s; Dev=30 s with IPA (100), EG (100), EG/IPA (70/30), and EG/water (90/10).

Figure 2A:
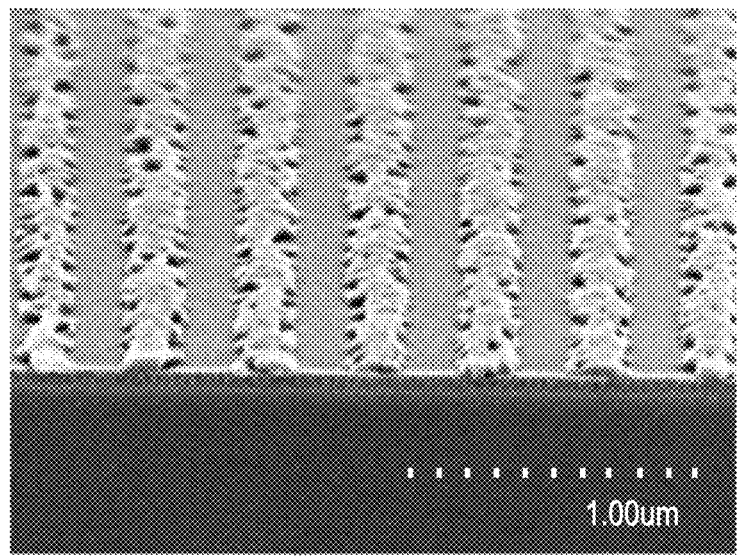
FIGS. 2A-2D show KrF imagining results for molecular glass NORIA-MAdMA resists developed with IPA (100); EG (100), EG/IPA (70/30); and EG/water (90/10).
Figure 2B:
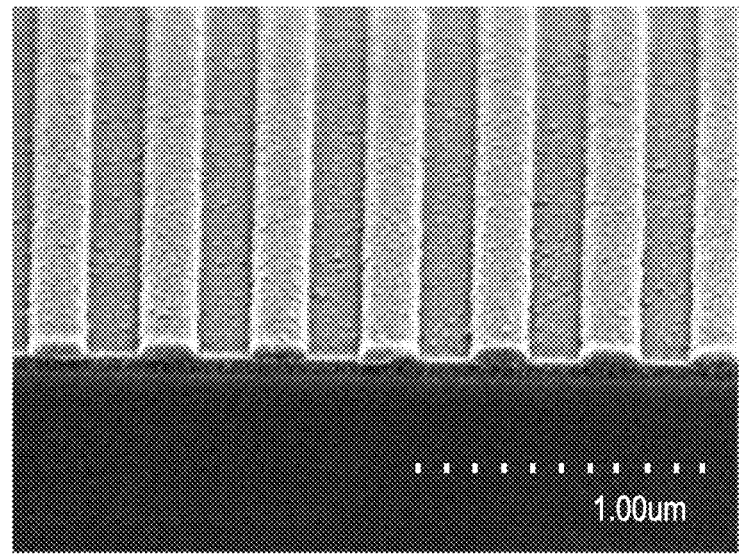
Figure 2C:
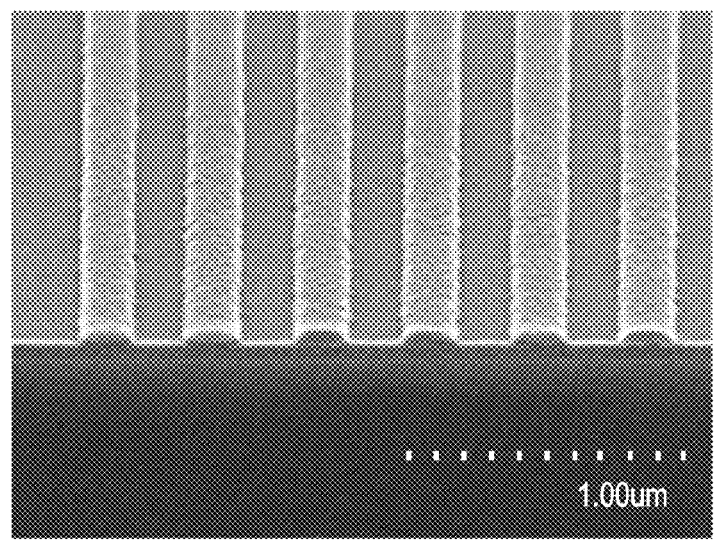
Figure 2D:
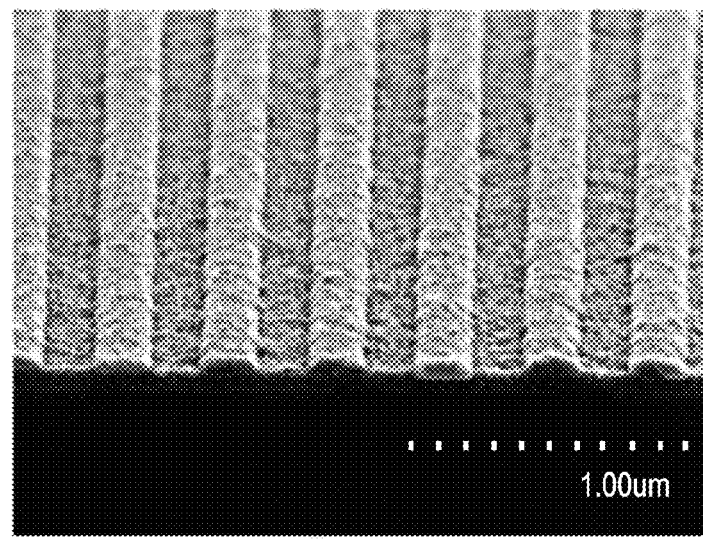

FIGS. 2A-2D show SEM line/space (LS) patterns at 200 nm critical dimension (CD) at the following KrF laser doses: 25 mJ/cm$^2$ (FIG. 2A); 27 mJ/cm$^2$ (FIGS. 2B and 2C); and 29 mJ/cm$^2$ (FIG. 2D).

EXAMPLE 3

KrF Exposure of NORIA-MAdMA Resists

KrF contrast curve data for the NORIA-MAdMA resist of Table 1 is shown in FIGS. 3 and 12. The resists were prepared with the following materials and processing conditions: Resist composition=NORIA-MAdMA/TPS-N/TPS-HFB; Substrate=DUV42P; FT=60 nm; PAB=110° C./60 s; Exposure=KrF; PEB=110° C./60 s; Dev=30 s with EG (100), EG/IPA (70/30) and (50/50), EG/water (90/10), and TMAH (100) (FIG. 3); and Dev=60 s with glycerol (100), glycerol/water (80/20), and glycerol/IPA (70/30) and (50/50) (FIG. 12).

EXAMPLE 4

E-Beam Imaging of NORIA-MAdMA Resists

Top-down SEM images for the e-beam exposed NORIA-MAdMA resist of Table 1 are shown in FIGS. 4A-4D. The resists were prepared with the following materials and processing conditions: Resist composition=NORIA-MAdMA/TPS-N/TPS-HFB; Substrate=DUV42P; FT=60 nm; PAB=110° C./60 s; Exposure=e-beam; PEB=110° C./60 s; Dev=30 s with TMAH (100) and EG (100).

FIGS. 4A-4D show SEM L/S patterns at the following e-beam doses and critical dimensions: Es=155 µC/cm$^2$ and CD=60 nm (FIG. 4A); Es=160 µC/cm$^2$ and CD=40 nm (FIG. 4B); Es=170 µC/cm$^2$ and CD=60 nm (FIG. 4C); and Es=155 µC/cm$^2$ and CD=40 nm (FIG. 4D).

EXAMPLE 5

EUV Imaging of NORIA-MAdMA Resists

Top-down SEM images for the EUV exposed NORIA-MAdMA resist of Table 1 are shown in FIGS. 5A-5C. The resists were prepared with the following materials and processing conditions: Resist composition=NORIA-MAdMA/TPS-N/TPS-HFB; Substrate=DUV42P; FT=60 nm; PAB=110° C./60 s; Exposure=EUV; PEB=110° C./60 s; Dev=30 s with EG (100).

FIGS. 5A-5C show SEM L/S patterns at the EUV dose of 21 mJ/cm$^2$ and the following critical dimensions: CD=28 nm (FIG. 5A); CD=30 nm (FIG. 5B); and CD=32 nm (FIG. 5C).

EXAMPLE 6

KrF Exposure of PHS-MAdMA Resists

KrF contrast curve data for the PHS-MAdMA resist of Table 1 is shown in FIG. 6. The resists were prepared with the following materials and processing conditions: Resist composition=PHS-MAdMA/TPS-N/TPS-HFB; Substrate=DUV42P; FT=60 nm; PAB=110° C./60 s; Exposure=KrF; PEB=110° C./60 s; Dev=30 s with EG (100), EG/water (90/10), (85/15), and (75/25), and TMAH (100).

EXAMPLE 7

EUV Imaging of PHS-MAdMA Resists

Top-down SEM images for the EUV exposed PHS-MAdMA resist of Table 1 is shown in FIGS. 7A and 7B. The resists were prepared with the following materials and processing conditions: Resist composition=PHS-MAdMA/TPS-N/TPS-HFB; Substrate=DUV42P; FT=60 nm; PAB=110° C./60 s; Exposure=EUV; PEB=110° C./60 s; Dev=30 s with EG (100). FIGS. 7A and 7B show SEM L/S patterns at the EUV dose of 22 mJ/cm$^2$ and the following critical dimensions: CD=32 nm (FIG. 7A) and CD=36 nm (FIG. 7B).

EXAMPLE 8

KrF Exposure of Methacrylate-Type Resists

KrF contrast curve data for the methacrylate-fluoroalcohol and methacrylate resists of Table 1 are shown in FIG. 8. The resists were prepared with the following materials and processing conditions: Resist compositions=NBHFA-MAdMA/TPS-N/TPS-HFB, NBHFA-EcEdMA/TPS-N/TPS HFB, and Hd-MCpMA/TPS-N/TPS-HFB; Substrate=DUV42P; FT=60 nm; PAB=110° C./60 s; Exposure=KrF; PEB=110° C./60 s; Dev=30 or 60 s with EG (100), EG/IPA (70/30) and (50/50).

EXAMPLE 9

ArF Exposure of Methacrylate-Type Resists

ArF contrast curve data for the methacrylate-fluoroalcohol and methacrylate resists of Table 1 are shown in FIGS. 9 and 11. The resists were prepared with the following materials and processing conditions: Resist compositions=NBHFA-MAdMA/TPS-N/TPS-HFB, NBHFA-MAdMA/NBHFA-MCpMA (10/90)/TPS-N/TPS HFB, NBHFA-EcEdMA/TPS-N/TPS HFB and Hd-MCpMA/TPS-N/TPS-HFB; Substrate=ARC29A; FT=60 nm; PAB=110° C./60 s; Exposure=ArF; PEB=110° C./60 s; Dev=60 s with EG/IPA (70/30) and (50/50) and glycerol/IPA (50/50).

EXAMPLE 10

EUV Imaging of NBHFA-MAdMA Resists

Top-down SEM images for the EUV exposed NBHFA-MAdMA/NBHFA-MCpMA (10/90) resist of Table 1 are shown in FIGS. 10A-10C. The EUV imaging was carried out with the following materials and processing conditions: Resist composition=NBHFA-MAdMA/NBHFA-MCpMA (10/90)/TPS-N/TPS-HFB); Substrate=DUV 2P; FT=60 nm; PAB=110° C./60 s; Imaging=EUV LBNL-MET (Rotated Dipole); PEB=110° C./60 s; Dev=30 s with EG/IPA (70/30).

FIGS. 10A-10C show SEM L/S patterns at the EUV dose of 21 mJ/cm$^2$ (FIGS. 10A and 10B) and 20 mJ/cm$^2$ (FIG. 10C) and the following critical dimensions: CD=30 nm (FIG. 10A); CD=32 nm (FIG. 10B); and CD=36 nm (FIG. 10C).

We claim:

1. A method comprising:
   developing a positive tone image in a chemically amplified resist with an organic developer solvent, wherein the organic developer solvent comprises a polyhydric alcohol and further wherein the organic developer solvent has no more than $2.6 \times 10^{-4}$ M hydroxide ions.

2. The method of claim 1, wherein the organic developer solvent has no more than $1.0 \times 10^{-4}$ M hydroxide ions.

3. The method of claim 1, wherein the organic developer solvent is free of hydroxide ions.

4. The method of claim 1, wherein the polyhydric alcohol is ethylene glycol.

5. The method of claim 1, wherein the organic developer solvent comprises a mixture of ethylene glycol and water.

6. The method of claim 1, wherein the polyhydric alcohol is glycerol.

7. The method of claim 1, wherein the organic developer solvent includes an additional organic solvent.

8. The method of claim 7, wherein the polyhydric alcohol is ethylene glycol and the organic developer solvent comprises a mixture of ethylene glycol and isopropyl alcohol.

9. The method of claim 7, wherein the polyhydric alcohol is glycerol and the organic developer solvent comprises a mixture of glycerol and isopropyl alcohol.

10. The method of claim 1, wherein the chemically amplified resist comprises a composition selected from the group consisting of molecular glasses, polyhydroxystyrenes, styrenes having one or more pendant hexafluoroalcohol groups, acrylates, methacrylates, and methacrylate fluoroalcohols.

11. The method of claim 1, wherein the chemically amplified resist comprises a styrenic molecular glass.

12. The method of claim 11, wherein the styrenic molecular glass is NORIA molecular glass protected with a 2-methyl-2-adamantyl group (NORIA-MAdMA).

13. The method of claim 1, wherein the chemically amplified resist comprises a polyhydroxystyrene polymer.

14. The method of claim 13, wherein the polyhydroxystyrene polymer is poly(4-hydroxystyrene-co-2-methyl-2-adamantyl methacrylate) (PHS-MAdMA).

15. The method of claim 1, wherein the chemically amplified resist comprises a methacrylate-fluoroalcohol polymer.

16. The method of claim 15, wherein the methacrylate-fluoroalcohol polymer is selected from the group consisting of poly(5-acryloyloxy-2,6-norbornanecarbolactone-co-2-methyl-2-adamantyl methacrylate-co-2-[1',1',1'-trifluoro-2'-(trifluoromethyl)-2'-hydroxy)propyl-3-norbornyl methacrylate) (NBHFA-MAdMA); poly(5-acryloyloxy-2,6-norbornanecarbolactone-co-2-methyl-2-cyclopentayl methacrylate-co-2-[1',1',1'-trifluoro-2'-(trifluoromethyl)-2'-hydroxy)propyl-3-norbornyl methacrylate) (NBHFA-McPMA); and poly(5-acryloyloxy-2,6-norbornanecarbolactone-co-2-ethyl-2-cyclopentayl methacrylate-co-2-ethyl-2-adamantyl methacrylate-co-2-[1',1',1'-trifluoro-2'-(trifluoromethyl)-2'-hydroxy)propyl-3-norbornyl methacrylate) (NBHFA-EcEdMA).

17. The method of claim 1, wherein the chemically amplified resist comprises a methacrylate polymer.

18. The method of claim 17, wherein the methacrylate polymer is poly((1-methylcyclopentyl methacrylate)-co-(2-methyltricyclo[3.3.1.13,7]decan-2-yl methacrylate)-co-(3-(2-hydroxyethoxy)tricyclo[3.3.1.13,7]decan-1-yl methacrylate)-co-(4-oxa-5-oxotricyclo[4.2.1.03,7]nonan-2-yl methacrylate)) (Hd-MCpMA).

19. A method comprising the steps of:
   (a) dissolving, in a casting solvent, a composition comprising a resist polymer;
   (b) coating a substrate with the dissolved composition of step (a) to produce a resist film;
   (c) optionally baking the resist film of step (b);
   (d) exposing the resist film to radiation;
   (e) optionally baking the resist film of step (d);
   (f) developing the resist film with an organic developer solvent to dissolve exposed regions of the film and produce a positive-tone image on the substrate, wherein the organic developer solvent comprises a polyhydric alcohol and further wherein the organic developer solvent has no more than $2.6 \times 10^{-4}$ M hydroxide ions; and
   (g) optionally rinsing the film with water after development.

20. The method of claim 19, wherein the organic developer solvent of step (f) has no more than $1.0 \times 10^{-4}$ M hydroxide ions.

21. The method of claim 19, wherein the organic developer solvent of step (f) is free of hydroxide ions.

22. The method of claim 19, wherein the polyhydric alcohol of step (f) is ethylene glycol.

23. The method of claim 22, wherein the organic developer solvent of step (f) comprises a mixture of ethylene glycol and water.

24. The method of claim 19, wherein the polyhydric alcohol of step (f) is glycerol.

25. The method of claim 19, wherein the organic developer solvent of step (f) includes an additional organic solvent.

26. The method of claim 25, wherein the polyhydric alcohol of step (f) is ethylene glycol and the organic developer solvent comprises a mixture of ethylene glycol and isopropyl alcohol.

27. The method of claim 25, wherein the polyhydric alcohol of step (f) is glycerol and the organic developer solvent comprises a mixture of glycerol and isopropyl alcohol.

28. The method of claim 19, wherein the resist polymer composition of step (a) further includes a photoacid generator (PAG).

29. The method of claim 28, wherein the PAG is triphenylsulfonium perfluoro-1-butanesulfonate (TPS-N).

30. The method of claim 19, wherein the resist polymer composition of step (a) further includes a quencher.

31. The method of claim 30, wherein the quencher is selected from the group consisting of base quenchers and radiation sensitive quenchers.

32. The method of claim 31, wherein the radiation sensitive quencher is a photodecomposable base (PDB).

33. The method of claim 32, wherein the PBD is triphenylsulfonium heptafluorobutyrate (TPS-HFB).

34. The method of claim 32, wherein the PDB is selected from the group consisting of Structures (1)-(10):

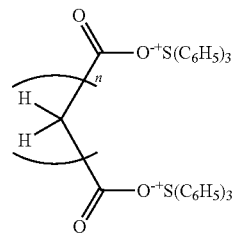

wherein n is 1, 2, or 3 and m is 1, 2, or 3

(1)

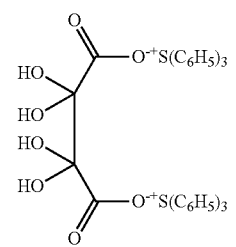

wherein n is 1, 2, or 3

(2)

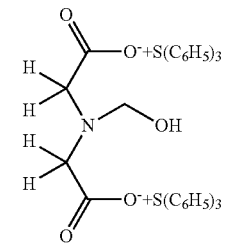

wherein n is 1, 3, or 4

(3)

(4)

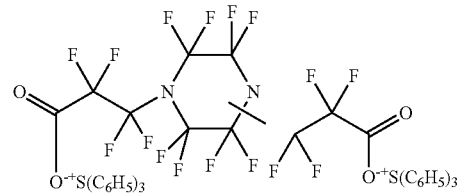

(5)

(6)

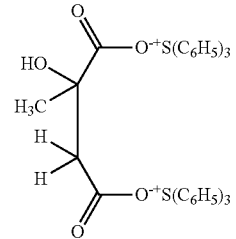

(7)

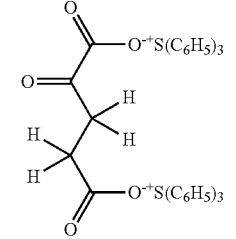

(8)

-continued

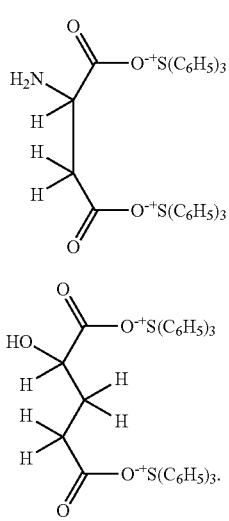

(9)

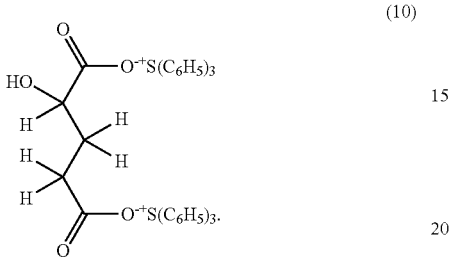

(10)

35. The method of claim 19, wherein the casting solvent of step (a) is selected from the group consisting of propylene glycol methyl ether acetate (PGMEA), propylene glycol monomethylether (PGME), and a combination of PGMEA and PGME.

36. The method of claim 19, wherein the radiation of step (d) is selected from the group consisting of deep ultraviolet (DUV) radiation, extreme ultraviolet (EUV) radiation, electron beam (e-beam) radiation, and ion-beam radiation.

* * * * *